United States Patent
Utsumi et al.

(10) Patent No.: US 10,689,748 B2
(45) Date of Patent: Jun. 23, 2020

(54) COATING

(71) Applicants: Sumitomo Electric Industries, Ltd., Osaka-shi (JP); MIMSI MATERIALS AB, Linkoeping (SE)

(72) Inventors: Yoshiharu Utsumi, Itami (JP); Paer Christoffer Arumskog, Itami (JP); Keiichi Tsuda, Itami (JP); Konstantinos Sarakinos, Linkoeping (SE); Daniel Gunnar Magnfaelt, Linkoeping (SE)

(73) Assignees: Sumitomo Electric Industries, Ltd., Osaka-shi (JP); Mimsi Materials AB, Linkoeping (SE)

( * ) Notice: Subject to any disclaimer, the term of this patent is extended or adjusted under 35 U.S.C. 154(b) by 191 days.

(21) Appl. No.: 15/744,486

(22) PCT Filed: Jul. 6, 2016

(86) PCT No.: PCT/JP2016/070016
§ 371 (c)(1),
(2) Date: Jan. 12, 2018

(87) PCT Pub. No.: WO2017/010374
PCT Pub. Date: Jan. 19, 2017

(65) Prior Publication Data
US 2018/0195161 A1   Jul. 12, 2018

(30) Foreign Application Priority Data
Jul. 15, 2015  (WO) .................. PCT/JP2015/070314

(51) Int. Cl.
*C23C 14/06* (2006.01)
*C23C 14/35* (2006.01)
(Continued)

(52) U.S. Cl.
CPC ...... *C23C 14/0617* (2013.01); *C23C 14/0036* (2013.01); *C23C 14/021* (2013.01);
(Continued)

(58) Field of Classification Search
USPC ................... 428/325, 697, 698, 699
See application file for complete search history.

(56) References Cited

U.S. PATENT DOCUMENTS

| | | | |
|---|---|---|---|
| 2014/0234616 A1* | 8/2014 | Hultman | C23C 14/0641 204/192.15 |
| 2014/0287209 A1* | 9/2014 | Kurapov | C23C 30/00 428/697 |

FOREIGN PATENT DOCUMENTS

| | | |
|---|---|---|
| CN | 101164773 A | 4/2008 |
| JP | H06-279990 A | 10/1994 |

(Continued)

OTHER PUBLICATIONS

Greczynski et al "Srain-frr, single-phase metastable Ti)0.38)Al(0.62)N alloys with high hardness: metal-ion energy vs. momentume effects during film growth by hybrid high-power pulsed /dc magnetron cosputtering" Thin Solid Films 556 p. 87-98. (Year: 2014).*

(Continued)

*Primary Examiner* — Archene A Turner
(74) *Attorney, Agent, or Firm* — Baker Botts L.L.P.; Michael A. Sartori

(57) ABSTRACT

At least one layer in a coating located on a surface of a substrate is a domain structure layer constituted of two or more domains different in composition. The average value of the size of each of first domains, defined as the diameter of a virtual circumcircle in contact with each first domain, is 1 nm to 10 nm. The average value of the nearest neighbor distance of each first domain, defined as the length of the shortest straight line connecting the center of the circumcircle with the center of another circumcircle adjacent to the (Continued)

circumcircle, is 1 nm to 12 nm. 95% or more of the first domains has a size within ±25% of the average value of the size, and 95% or more of the first domains has a nearest neighbor distance within ±25% of the average value of the nearest neighbor distance.

12 Claims, 6 Drawing Sheets

(51) Int. Cl.
*C23C 28/04* (2006.01)
*C23C 14/54* (2006.01)
*C23C 14/02* (2006.01)
*C23C 30/00* (2006.01)
*C23C 14/34* (2006.01)
*C23C 28/00* (2006.01)
*C23C 14/00* (2006.01)
*C23C 14/50* (2006.01)
*H01J 37/34* (2006.01)

(52) U.S. Cl.
CPC ........ *C23C 14/024* (2013.01); *C23C 14/0641* (2013.01); *C23C 14/345* (2013.01); *C23C 14/3485* (2013.01); *C23C 14/35* (2013.01); *C23C 14/352* (2013.01); *C23C 14/505* (2013.01); *C23C 14/541* (2013.01); *C23C 14/545* (2013.01); *C23C 14/548* (2013.01); *C23C 28/044* (2013.01); *C23C 28/048* (2013.01); *C23C 28/44* (2013.01); *C23C 30/005* (2013.01); *H01J 37/3467* (2013.01)

(56) References Cited

FOREIGN PATENT DOCUMENTS

| JP | H07-003432 A | | 1/1995 |
|---|---|---|---|
| JP | 2001-293601 A | | 10/2001 |
| JP | 2002-096205 A | | 4/2002 |
| JP | 2008-100345 A | | 5/2008 |
| JP | 2013-096004 A | | 5/2013 |
| JP | 2014-155984 | * | 8/2014 |

OTHER PUBLICATIONS

Horling et al "Mechanical properties abd machining performance Ti(1-x)Al(X)N-coated cutting tools" Surf & Coat. Techn 191 p. 384-392. (Year: 2005).*

Horling et al "Thermal stability of arc evaporated high aluminium-content Ti(1-x)Al(x)N thin films". J.Vac Sci. Technol A 20(5) p. 1815-1823. (Year: 2002).*

Oden et al., "In situ small-angle x-ray scattering study of nanostructure evolution during decomposition of arc evaporated TiAlN coatings," Applied Physics Letters 94:053114, 3 pages. (2009).

Norrby et al., "In situ X-ray scattering study of the cubic to hexagonal transformation of AlN in Ti1_xAl xN," Acta Materialia 73:205-214 (2014).

Christiansen et al., "Microstructure of novel superhard nanocrystalline-amorphous composites as analyzed by high resolution transmission electron microscopy," J. Vac. Sci. Technol. B 16(1):19-22 (1998).

* cited by examiner

COATING

TECHNICAL FIELD

The present disclosure relates to a coating located on a surface of a substrate. The present application claims priority to the International Application PCT/JP2015/070314 filed on Jul. 15, 2015, the entire content of which is incorporated herein by reference.

BACKGROUND ART

In order to improve various characteristics of industrial products such as cutting tools, wear-resistant tools, molds, and electronic components, a coating having characteristic physical properties has conventionally been provided on a surface of such a substrate through vapor deposition.

Vapor deposition includes physical vapor deposition (PVD) or chemical vapor deposition (CVD). In particular, since a coating formed through PVD decreases the likelihood of a deterioration in strength of the substrate, it has widely been used for a cutting tool required to be high in strength, such as drills, end mills, and indexable inserts for milling, wear-resistant tools, and molds. In particular, demands for tools include adaptation to dry cutting without the use of a cutting fluid and higher cutting speed. In order to meet such demands, the coating provided on the surface of the substrate is required to have high hardness and good wear resistance.

For the purpose of improving the hardness and wear resistance of a coating, a coating in which a specific compound is stacked or combined on a scale as fine as a nanometer, thus having nanometer order, has been studied. For example, PTD 1 (Japanese Patent Laying-Open No. 07-003432) discloses a coating in which two or more types of layers each having a thickness on the order of nanometers are alternately stacked, and PTD 2 (Japanese Patent Laying-Open No. 06-279990, PTD 3 (Japanese Patent Laying-Open No. 2001-293601), and PTD 4 (Japanese Patent Laying-Open No. 2002-096205) each disclose a coating having a layer containing fine particles on the order of nanometers.

In such a coating which is a stack or combination on a scale as small as the nanometer order, a hardness of the coating itself tends to be high owing to nanometer size effect. Furthermore, strain energy is likely to be accumulated at an interface between compounds different in composition. Coatings in which strain energy is accumulated have been known to be high in hardness. That is, according to the conventional art, attempts to improve the hardness of a coating based on the nanometer size effect and accumulation of strain energy and to thereby improve wear resistance of the coating have been made.

CITATION LIST

Patent Document

PTD 1: Japanese Patent Laying-Open No. 07-003432
PTD 2: Japanese Patent Laying-Open No. 06-279990
PTD 3: Japanese Patent Laying-Open No. 2001-293601
PTD 4: Japanese Patent Laying-Open No. 2002-096205

SUMMARY OF INVENTION

A coating according to one manner of the present invention is a coating located on a surface of a substrate. The coating includes one or more layers, and at least one of the layers is a domain structure layer constituted of two or more domains different in composition. A first domain and a second domain which are two of the two or more domains are composed of at least one element selected from the group consisting of Al, B, Si, and elements of group 4, 5, 6 in the periodic table and at least one element selected from the group consisting of B, O, C, and N. A plurality of first domains are present in the domain structure layer. When a size of each first domain in an in-plane direction of the domain structure layer is defined as a diameter of a virtual circumcircle in contact with each first domain and a nearest neighbor distance of each first domain in the in-plane direction of the domain structure layer is defined as a length of a shortest straight line connecting a center of the circumcircle with a center of another circumcircle adjacent to the circumcircle, an average value of the size of each first domain is not smaller than 1 nm and not greater than 10 nm and an average value of the nearest neighbor distance of each first domain is not smaller than 1 nm and not greater than 12 nm, 95% or more of the first domains has a size in a range of not more than ±25% of the average value of the size, and 95% or more of the first domains has a nearest neighbor distance in a range of not more than ±25% of the average value of the nearest neighbor distance.

DESCRIPTION OF EMBODIMENTS

Figure 1:
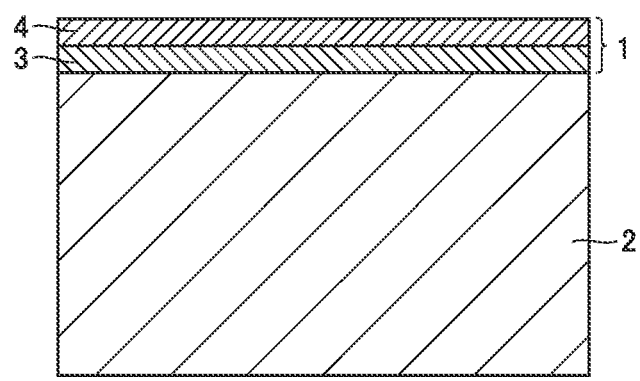
FIG. 1 is a cross-sectional view showing one example of a coating according to one embodiment of the present invention.

[Problems to be Solved by the Present Disclosure]

The conventional art still has a room for improvement in such physical properties as hardness and wear resistance. For example, in PTD 1, though a large number of crystal interfaces are present in the thickness direction, there is also a region where no crystal interface is present in the direction perpendicular to the thickness direction (the in-plane direction). That is, crystal interfaces present in the coating in PTD 1 extend only in one direction. Therefore, the degree of accumulation of strain energy is limited.

In PTDs 2 to 4, control of the extent of distribution of fine particles tends to be difficult and hence there may be a portion where fine particles identical in composition are adjacent to each other. In the portion where fine particles identical in composition are adjacent to each other, larger sized particles are apparently present and the nanometer size effect may not be obtained. In addition, since no strain energy is generated at the crystal interface where fine particles identical in composition are adjacent to each other, strain energy accumulated as a whole may be low.

An object of the present disclosure is to provide a coating excellent in hardness and wear resistance.

[Effects of the Present Disclosure]

According to the above, a coating excellent in hardness and wear resistance can be provided.

[Description of Embodiments of the Present Invention]

A manner of carrying out the present invention will initially be listed and described.

[1] A coating according to one manner of the present invention is a coating located on a surface of a substrate. The coating includes one or more layers, and at least one of the layers is a domain structure layer constituted of two or more domains different in composition. A first domain and a second domain which are two of the two or more domains are composed of at least one element selected from the group consisting of Al, B, Si, and elements of group 4, 5, 6 in the periodic table and at least one element selected from the group consisting of B, O, C, and N. A plurality of first domains are present in the domain structure layer. When the size of each first domain in the in-plane direction of the domain structure layer is defined as the diameter of a virtual circumcircle in contact with each first domain and the nearest neighbor distance of each first domain in the in-plane direction of the domain structure layer is defined as the length of the shortest straight line connecting the center of the circumcircle with the center of another circumcircle adjacent to the circumcircle, the average value of the size of each first domain is not smaller than 1 nm and not greater than 10 nm and the average value of the nearest neighbor distance of the first domain is not smaller than 1 nm and not greater than 12 nm, 95% or more of the first domains has a size in the range of not more than ±25% of the average value of the size, and 95% or more of the first domains has a nearest neighbor distance in the range of not more than ±25% of the average value of the nearest neighbor distance.

Here, the expression "different in composition" herein means a concept including naturally a case that constituent elements do not completely match and also a case that elements completely match, although the content thereof is different. Therefore, for example, "AlN" and "TiN" are different in composition from each other, and "$Al_{0.6}Ti_{0.4}N$" and "$Al_{0.4}Ti_{0.6}N$" are also different in composition from each other. Strain energy is generated at an interface between such compositions different from each other.

According to the coating, the average value of the size of the first domain is not smaller than 1 nm and not greater than 10 nm, 95% or more of the first domains has a size which scatters not more than 25% from the average value of the size, and 95% or more of the first domains has a nearest neighbor distance which scatters not more than 25% from the average value of the nearest neighbor distance. That is, in the domain structure layer, the first domain is uniform in nanometer size and uniformly distributed. According to the coating, the average value of the nearest neighbor distance of the first domain is not smaller than 1 nm and not greater than 12 nm. That is, the second domain is also of the nanometer order in a region between adjacent first domains.

Therefore, the domain structure layer can exhibit a great nanometer size effect, and high strain energy is accumulated owing to presence of a large number of interfaces between the first domain and the second domain. Therefore, the domain structure layer can be excellent in hardness and wear resistance.

[2] In the coating in [1], the domain structure layer may be constituted of the first domain and the second domain. In this case as well, the effect above can be achieved.

[3] In the coating in [1] and [2], one of the first domain and the second domain may be composed of a nitride containing at least Al but not containing Ti and the other of the first domain and the second domain may be composed of a nitride containing at least Al and Ti. A nitride containing at least Al and Ti is excellent in hardness and oxidation resistance. Though a nitride containing at least Al but not containing Ti is lower in hardness than the nitride containing Al and Ti, it is superior in oxidation resistance because it contains no Ti. Since the domain structure layer constituted of the first domain and the second domain is composed of the nitride containing Al and Ti excellent in hardness and oxidation resistance and the nitride containing Al which is poorer in hardness but better in oxidation resistance, it can have a hardness and oxidation resistance higher than those of a layer composed of any one nitride.

[4] In the coating in [3], one of the first domain and the second domain can be composed of AlN and the other of the first domain and the second domain can be composed of $Al_xTi_{1-x}N$, where the atomic ratio Al/Ti between Al and Ti in $Al_xTi_{1-x}N$ is not lower than 1 and not higher than 1.5. In this case, the effect the same as above is obtained and more inexpensive manufacturing can be achieved due to lower material cost.

[5] In the coating in [1] and [2], one of the first domain and the second domain may be composed of a nitride containing at least Al but not containing Ti and the other of the first domain and the second domain may be composed of a nitride containing at least Ti but not containing Al. Such a domain structure layer has composition similar to the nitride containing Al and Ti as the entire domain structure layer. Therefore, according to the coating, a high hardness and high oxidation resistance specific to the nitride containing Al and Ti can be achieved.

[6] In the coating in [5], one of the first domain and the second domain can be composed of AlN and the other of the first domain and the second domain can be composed of TiN. In this case, the effect the same as above is obtained and more inexpensive manufacturing can be achieved due to lower material cost.

[7] In the coating in [1] to [6], preferably, the atomic ratio Al/Ti between Al and Ti in the entire domain structure layer exceeds 1.5. Since the nitride containing Al and Ti tends to be excellent in hardness and oxidation resistance as the Al/Ti ratio in the entire coating is higher, the coating including such a domain structure layer can have a higher hardness and higher oxidation resistance.

[8] In the coating in [1] and [2], preferably, the first domain and the second domain are composed of a nitride containing at least Al and Ti, and the atomic ratio Al/Ti between Al and Ti in one of the first domain and the second domain is not lower than 1 and the atomic ratio Al/Ti between Al and Ti in the other of the first domain and the second domain is lower than 1. Such a domain structure layer has composition similar to the nitride containing Al and Ti as the entire domain structure layer. Therefore, according to the coating, in addition to the effect described above, a high hardness and high oxidation resistance specific to the nitride containing Al and Ti can further be achieved.

[9] In the coating in [1] to [8], the first domain and the second domain are preferably crystalline. In this case, since high strain energy owing to mismatch in crystal lattice (difference in lattice constant) between the first domain and the second domain is generated, the hardness of the coating can further be higher. Being crystalline is a concept encompassing both single crystals and polycrystals.

[10] In the coating in [1] to [9], the first domain and the second domain preferably have crystal structure of a cubic NaCl type. In this case, since the hardness of each of the first domain and the second domain is high, the hardness of the coating can consequently be even higher.

[11] In the coating in [1] to [10], a plurality of second domains are present in the domain structure layer, when the size of each second domain in the in-plane direction of the domain structure layer is defined as the diameter of a virtual circumcircle in contact with each second domain and the nearest neighbor distance of each second domain in the in-plane direction of the domain structure layer is defined as the length of the shortest straight line connecting the center of the circumcircle with the center of another circumcircle adjacent to the circumcircle, the average value of the size of each second domain is not smaller than 1 nm and not greater than 10 nm and the average value of the nearest neighbor distance of each second domain is not smaller than 1 nm and not greater than 12 nm, 95% or more of the second domains has a size in the range of not more than ±25% of the average value of the size, and 95% or more of the second domains has a nearest neighbor distance in the range of not more than ±25% of the average value of the nearest neighbor distance. In this case, a greater effect resulting from the nanometer order is obtained and strain energy is also higher.

[12] In the coating in [1] to [11], the domain structure layer is formed through PVD. Such a domain structure layer is better in hardness and wear resistance as well as in adhesiveness to a substrate than a film manufactured with CVD.

[Details of Embodiments of the Present Invention]

One embodiment of the present invention (hereinafter denoted as the "present embodiment") will be described hereinafter, however, the present embodiment is not limited thereto.

An expression in a form "A to B" herein means the upper limit and the lower limit of the range (that is, not less than A and not more than B). When a unit for A is not given and a unit is given only for B, the unit for A and the unit for B are the same. When a compound is herein expressed with a chemical formula such as AlN and when the atomic ratio is not particularly limited, all conventionally known atomic ratios are encompassed and a compound is not necessarily limited only to a compound within a stoichiometric range.

[First Embodiment: Coating]

FIG. 1 is a cross-sectional view showing one example of a coating according to the present embodiment. Referring to FIG. 1, a coating 1 is provided on a surface of a substrate 2. A shape of substrate 2 is not particularly limited and the material therefor is not particularly limited either. For example, when substrate 2 is a base for a cutting tool, a material which can withstand cutting resistance such as cemented carbide, steel, cermet, ceramics, and a diamond sintered material can suitably be employed.

Coating 1 includes one or more layers, and at least one of the layers is a domain structure layer constituted of two or more domains different in composition. The number of layers in coating 1 is not particularly limited and the position of the domain structure layer is not particularly limited either. Coating 1 according to the present embodiment has such a construction that an underlying layer 3 and a domain structure layer 4 are stacked in this order as seen from substrate 2.

Though the thickness of coating 1 is not particularly limited either, coating 1 preferably has a thickness from 0.1 to 10 μm, for example, when substrate 2 is the base for a tool.

[Domain Structure Layer]

Figure 2:
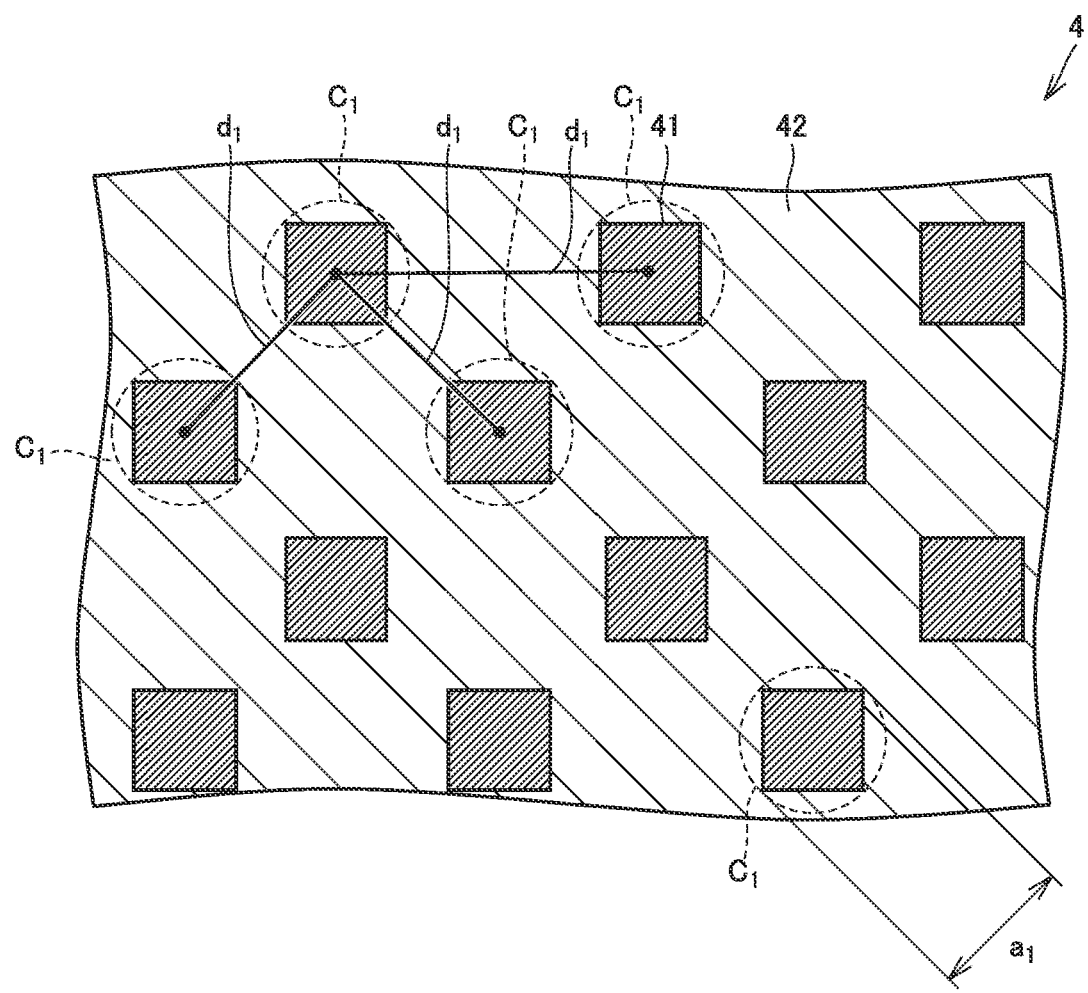
FIG. 2 is a cross-sectional view schematically showing a construction of any cross-section in an in-plane direction of a domain structure layer by way of example.

FIG. 2 is a cross-sectional view schematically showing a construction of any cross-section in the in-plane direction of the domain structure layer by way of example. The in-plane direction of the domain structure layer means the direction orthogonal to the thickness direction of the domain structure layer.

Referring to FIG. 2, domain structure layer 4 is constituted of a first domain 41 and a second domain 42. First domain 41 and second domain 42 should be different in composition from each other. In the present embodiment, a plurality of first domains 41 are present in domain structure layer 4, and second domain 42 is continuously present to surround each first domain 41. That is, domain structure layer 4 in the present embodiment has what is called a sea-island structure. In the present embodiment, for facilitating understanding, first domain 41 is shown to have a square shape and second domain 42 is shown to have a shape surrounding a plurality of squares, however, a shape of first domain 41 and second domain 42 is not particularly limited and their shape may vary.

First domain 41 and second domain 42 are composed of at least one element selected from the group consisting of Al, B, Si, and elements of group 4 (Ti, Zr, Hf), 5 (V, Nb, Ta), and 6 (Cr, Mo, W) in the periodic table and at least one element selected from the group consisting of B, O, C, and N. When the former group includes B, the latter group does not include B. That is, when B grouped in the former group representing a group of metal elements is included in each composition, B grouped in the latter group representing a group of non-metal elements cannot be included, and when B grouped in the latter group is included, B grouped in the former group cannot be included. First domain 41 and second domain 42 may contain an inevitable impurity.

A compound composed as such is excellent in wear resistance, oxidation resistance, and high-temperature stability. Therefore, domain structure layer 4 having first domain 41 and second domain 42 composed as above is suitable for cutting tools, wear-resistant tools, and molds. The composition of each domain can be confirmed by evaluating a cross-section of domain structure layer 4 with a transmission electron microscope equipped with an energy dispersive X-ray spectrometer or three-dimensional atom probe tomography.

Each of a plurality of first domains 41 has a size and the nearest neighbor distance. Herein, the size of first domain 41 is defined as the diameter of a virtual circumcircle in contact with first domain 41, and the nearest neighbor distance of first domain 41 is defined as the shortest straight line between the center of the virtual circumcircle in contact with first domain 41 and the center of another virtual circumcircle adjacent to the circumcircle. Specifically, each value is determined as follows.

Referring to FIG. 2, initially, any cross-section in the in-plane direction of domain structure layer 4 is evaluated with a transmission electron microscope or three-dimensional atom probe tomography. Domains different in composition can thus be distinguished from each other. Then, a virtual circumcircle $C_1$ is drawn for a plurality of first domains 41, constituting the island structure, of the measured domains. The diameter $a_1$ of each virtual circumcircle $C_1$ is defined as the size of each first domain 41. In addition, each straight line $d_1$ between the central point of virtual circumcircle $C_1$ in one first domain 41 and the central point of virtual circumcircle $C_1$ in each of other plurality of first domains 41 adjacent to that one first domain 41 is measured. The shortest of these straight lines $d_1$ is defined as the nearest neighbor distance of that one first domain 41.

First domain 41 in the present embodiment is characterized by satisfying (1) to (4) below for the size and the nearest neighbor distance.

(1) The average value of the size of first domain 41 is from 1 to 10 nm.

(2) The average value of the nearest neighbor distance of first domain 41 is from 1 to 12 nm.

(3) Ninety-five percent or more of first domains 41 has a size in the range of not more than ±25% of the average value of the size.

(4) Ninety-five percent or more of first domains 41 has a nearest neighbor distance in the range of not more than ±25% of the average value of the nearest neighbor distance.

In connection with (1), the "average value of the size of first domain 41" means the average value of diameters $a_1$ of at least 100 virtual circumcircles $C_1$. Though the size at which a hardness of first domain 41 is highest owing to the effect resulting from the nanometer order is different depending on composition of first domain 41, a sufficiently high hardness can be exhibited so long as the average value of the size of first domains 41 is at least within the range above.

In connection with (2), the "average value of the nearest neighbor distance of first domain 41" means the average value of the nearest neighbor distances of at least 100 first domains 41. From the difference between the average value of the size of first domain 41 and the average value of the nearest neighbor distance of first domain 41, it can be seen that the width of second domain 42 present between first domains 41 is on the nanometer order. The average value of the nearest neighbor distance is not smaller than the average value of diameter $a_1$.

In connection with (3), for example, when the average value of the size of 100 first domains 41 is 10 nm, 95 or more first domains 41 have the size within the range from 7.5 to 12.5 nm. That is, a plurality of first domains 41 are uniform in size.

In connection with (4), for example, when the nearest neighbor distance of 100 first domains 41 is 10 nm, 95 or more first domains 41 have the nearest neighbor distance within the range from 7.5 to 12.5 nm. That is, a plurality of first domains 41 are uniformly distributed.

Domain structure layer 4 in the present embodiment can achieve the following effect by satisfying all of (1) to (4) above. Firstly, since first domains 41 are uniformly distributed, the conventional problem caused by adjacent particles is suppressed and hence lowering in hardness thereby can be suppressed. Since first domains 41 are uniform in nanometer size and uniformly distributed, a significant nanometer size effect can be achieved and much strain energy can be accumulated. Furthermore, since both of first domain 41 and second domain 42 present between first domains 41 are of the nanometer order, more interfaces are present within domain structure layer 4 and hence more strain energy resulting from presence of the interfaces can be accumulated. Therefore, coating 1 having domain structure layer 4 can exhibit a high hardness and hence high wear resistance.

In contrast, when domain structure layer 4 does not satisfy (1) above, for example, when the average value of the size of first domains 41 is smaller than 1 nm, domain structure layer 4 exhibits a physical property as if it were composed of a single solid solution. Then, the nanometer size effect is not exhibited and the hardness is lower. Alternatively, when the average value of the size of first domains 41 is greater than 10 nm, the nanometer size effect is significantly lower. The average value of the size of first domains 41 is preferably from 1 to 5 nm and further preferably from 2 to 5 nm.

When domain structure layer 4 does not satisfy (2) above, for example, when the average value of the nearest neighbor distance of first domains 41 is greater than 12 nm, the total number of first domains 41 distributed in domain structure layer 4 is small or the size of second domain 42 present between first domains 41 is excessively large, and consequently a degree of accumulation of strain energy lowers. The average value of the nearest neighbor distance of first domains 41 is preferably from 1 to 11 nm and further preferably from 2 to 11 nm.

When domain structure layer 4 does not satisfy (3) above, for example, when deviation exceeds ±25%, first domain 41 low in hardness increases and consequently a hardness of domain structure layer 4 lowers, because improvement in hardness owing to the nanometer size effect attains to a relative maximum value at a specific value (which is different depending on composition). Ninety-five percent or more of first domains 41 preferably has a size within the range of not more than ±15% from the average value of the size.

When domain structure layer 4 does not satisfy (4) above, a portion where first domains 41 are continuous (adjacent) tends to be present. Since strain energy is generated at an interface between compounds different in composition, no strain energy is accumulated in a portion where first domains 41 are continuous. When apparent first domain 41 is no longer of the nanometer order due to first domains 41 being continuous, the effect resulting from the nanometer order is not exhibited. Ninety-five percent or more of first domains 41 preferably has the nearest neighbor distance within the range of not more than ±15% from the average value of the nearest neighbor distance.

In domain structure layer 4 in the present embodiment described above, first domain 41 and second domain 42 may be crystalline or amorphous. In any of the cases of first domain 41 and second domain 42 both being amorphous, first domain 41 and second domain 42 being amorphous and crystalline, respectively, and first domain 41 and second domain 42 both being crystalline, the nanometer size effect can be achieved in domain structure layer 4 so long as composition is different therebetween. Since strain energy is accumulated owing to mismatch in crystal lattice, first domain 41 and second domain 42 are preferably crystalline.

When first domain 41 and second domain 42 are crystalline, the compositions of first domain 41 and second domain 42 are suitably combinations of a composition composed of an element having crystal structure other than a cubic NaCl type at room temperature and atmospheric pressure (composition A) and a composition composed of an element having crystal structure of the cubic NaCl type at room temperature and atmospheric pressure (composition B).

In such domain structure layer 4, since the domain having composition A is of the nanometer order, the crystal structure of composition A can change to the crystal structure of the cubic NaCl type under the influence by the crystal structure of composition B in contact therewith. With such change in crystal structure, high strain energy is generated in domain structure layer 4 and hence a hardness of domain structure layer 4 is further improved. Since the crystal structure of the cubic NaCl type tends to be higher in hardness than other crystal structures, it is excellent also in this regard. The crystal structure of each domain can be confirmed with a nanobeam electron diffraction method using a transmission electron microscope.

In coating 1 in the present embodiment, domain structure layer 4 is preferably composed of a nitride containing at least Al and Ti as a whole. Since the nitride containing Al and Ti is excellent in balance among a hardness, oxidation resistance, toughness, and non-reactivity with iron, coating 1 having domain structure layer 4 is suitable as a coating provided on a surface of a cutting tool, a wear-resistant tool, and a mold.

Since the nitride containing Al and Ti tends to be better in hardness and oxidation resistance as the Al/Ti ratio is higher, the Al/Ti ratio in the entire domain structure layer 4 composed of the nitride containing Al and Ti is preferably high. In domain structure layer 4, a high Al/Ti ratio can be realized using a combination of compositions of each domain. In particular, according to domain structure layer 4 in the present embodiment, the Al/Ti ratio in the entire domain structure layer 4 can also exceed 1.5.

The high Al/Ti ratio as described above is a value which cannot be achieved by a conventional AlTiN solid solution. In the AlTiN solid solution, when the Al/Ti ratio exceeds 1.5, Al can no longer be dissolved in a solid state in the AlTiN solid solution and Al tends to be segregated as AlN (w-AlN) having crystal structure of a hexagonal wurtzite type or amorphous AlN (a-AlN). Since w-AlN and a-AlN have a lower hardness than the AlTiN solid solution, segregation thereof in the AlTiN solid solution leads to a lowering of the hardness of the coating.

In domain structure layer 4 composed of the nitride containing Al and Ti, for the purpose of improvement in hardness and oxidation resistance, at least one element (except for Ti) selected from the group consisting of B, Si, and elements of group 4, 5, and 6 in the periodic table may be added as an additional element. Such an additional element may be substituted with Al or Ti or may form a solid solution as being introduced in between lattices. The atomic ratio of each additional element to the total amount of metal elements (the total amount of Al, Ti, and the additional element) is preferably not higher than 0.1 in the entire domain structure layer 4 and preferably not higher than 0.05 in each domain.

In domain structure layer 4 composed of the nitride containing Al and Ti described above, for example, one of first domain 41 and second domain 42 may be composed of a nitride containing Al but not containing Ti and the other may be composed of a nitride containing Al and Ti. In this case, since the high Al/Ti ratio in the entire domain structure layer 4 can be realized, a high hardness and high oxidation resistance can be achieved. Since first domain 41 and second domain 42 are significantly different in composition from each other, strain energy at an interface therebetween can be increased and hence a hardness of domain structure layer 4 is improved.

When a domain composed of the nitride containing Al and Ti satisfies composition B above and a domain composed of the nitride containing Al but not containing Ti satisfies composition A above, accumulation of strain energy with change in crystal structure of the domain made of composition A can also be achieved. As domain structure layer 4 satisfying this condition, a case that one of first domain 41 and second domain 42 is composed of AlN and the other is composed of $Al_xTi_{1-x}N$ can be mentioned. In this case, the Al/Ti ratio in the domain composed of the nitride containing Al and Ti is preferably from 1 to 1.5. When the ratio is lower than 1, the Al/Ti ratio of the entire domain structure layer is unfavorably low, and when the ratio is higher than 1.5, this tends to cause the unfavorable segregation of w-AlN or a-AlN within the domains.

In domain structure layer 4 composed of the nitride containing Al and Ti, one of first domain 41 and second domain 42 may be composed of a nitride containing Al but not containing Ti and the other may be composed of a nitride containing Ti but not containing Al. In this case as well, since domain structure layer 4 can realize the high Al/Ti ratio in the entire domain structure layer 4, a high hardness and high oxidation resistance can be achieved. Since first domain 41 and second domain 42 are significantly different in composition from each other, strain energy at an interface therebetween can be increased and hence a hardness of domain structure layer 4 is improved.

When a domain composed of the nitride containing Ti but not containing Al satisfies composition B above and a domain composed of the nitride containing Al but not containing Ti satisfies composition A above, accumulation of strain energy with change in crystal structure of the domain composed of composition A can also be achieved. As domain structure layer 4 satisfying this condition, a case that one of first domain 41 and second domain 42 is composed of AlN and the other is composed of TiN can be mentioned.

In domain structure layer 4 composed of the nitride containing Al and Ti, first domain 41 and second domain 42 may be composed of a nitride containing at least Al and Ti, the Al/Ti ratio of one of first domain 41 and second domain 42 may be not lower than 1, and the Al/Ti ratio of the other may be lower than 1. In this case, as compared with the case described above (a case that one is composed of AlN and the other is composed of TiN), both domains are composed of the nitride containing Al and Ti and hence the entire domain structure layer is also excellent in both characteristics of a hardness and oxidation resistance. In this case, however, from a point of view of prevention of segregation described above, the Al/Ti ratio is preferably not higher than 1.5.

In domain structure layer 4 composed of the nitride containing Al and Ti, first domain 41 or second domain 42 may naturally contain an additional element described above.

[Underlying Layer]

In the present embodiment, underlying layer 3 is preferably a solid solution layer composed of a solid solution. For example, when substrate 2 is composed of a sintered material composed of several different materials such as cemented carbide, a more homogenous domain structure layer 4 is obtained by providing a solid solution layer on the surface of the sintered material. This may be because, when domain structure layer 4 is provided directly on the surface of the sintered material, uniformity of domain structure layer 4 may be disturbed as affected by the sintered material. The solid solution preferably contains all elements forming domain structure layer 4. In this case, adhesiveness between domain structure layer 4 and the solid solution layer is further improved.

In the present embodiment described above in detail, a case that domain structure layer 4 is constituted of first domain 41 and second domain 42 has been described, however, the construction of domain structure layer 4 is not limited thereto. For example, the domain structure layer may be constituted of three types of domains different in composition from one another or four types of domains different in composition from one another.

Though the size of first domain 41 and the nearest neighbor distance of first domain 41 are determined in any cross-section in the in-plane direction of domain structure layer 4 in the present embodiment, similar conditions are preferably satisfied also in any cross-section in the direction of thickness of domain structure layer 4.

Figure 3:
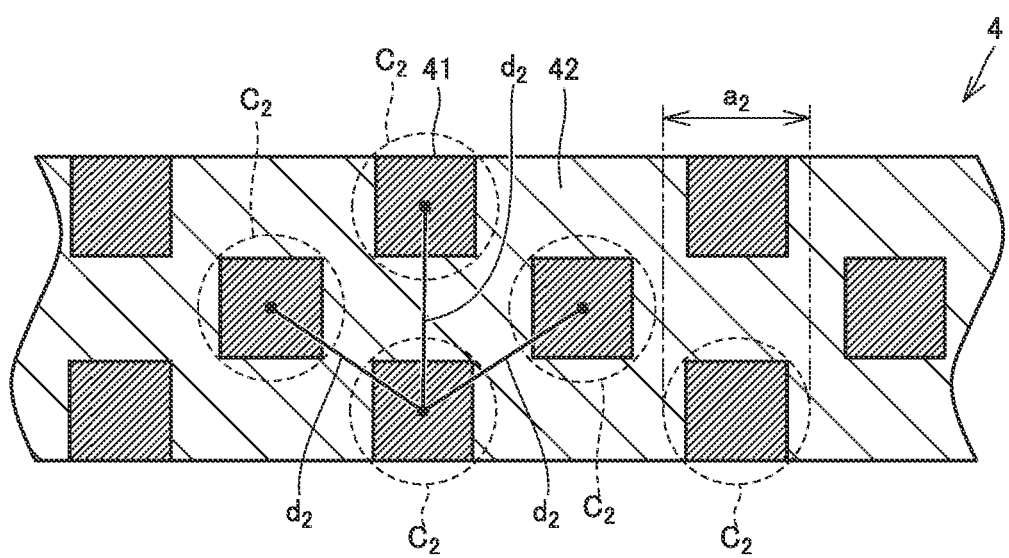
FIG. 3 is a cross-sectional view schematically showing a construction of any cross-section in a direction of thickness of the domain structure layer by way of example.

That is, referring to FIG. 3 which is a cross-sectional view schematically showing the construction of the domain structure layer in the direction of thickness, initially, any cross-section in the thickness direction of domain structure layer 4 is evaluated with a transmission electron microscope or three-dimensional atom probe tomography, and a virtual circumcircle $C_2$ is drawn for a plurality of measured first domains 41. The diameter $a_2$ of each virtual circumcircle $C_2$ is defined as the size of each first domain 41 in the direction of thickness of domain structure layer 4. In addition, each distance $d_2$ between the central point of virtual circumcircle $C_2$ in one first domain 41 and the central point of virtual circumcircle $C_2$ in each of other plurality of first domains 41 adjacent to that one first domain 41 is measured. The shortest of these straight lines $d_2$ is defined as the nearest neighbor distance of that one first domain 41 in the thickness direction of domain structure layer 4.

Then, (1) to (4) above for the size and the nearest neighbor distance in the direction of thickness of domain structure layer 4 are preferably satisfied. In this case, the effect described above can further be achieved. The size and the nearest neighbor distance in the direction of thickness of domain structure layer 4 may be the same as or different from the size and the nearest neighbor distance in the in-plane direction of domain structure layer 4 described above, respectively. With the fabrication method described later, each value in (1) to (4) above to be controlled tends to be smaller in the thickness direction.

[Second Embodiment: Coating]

Though a case that domain structure layer 4 has a sea-island structure has been described in the first embodiment, domain structure layer 4 is not limited to the construction above. In the present embodiment, a case that first domain 41 and second domain 42 are equal to each other in size and nearest neighbor distance will be described. In the present embodiment, differences from the first embodiment will be described and similar description will not be repeated.

Figure 4:
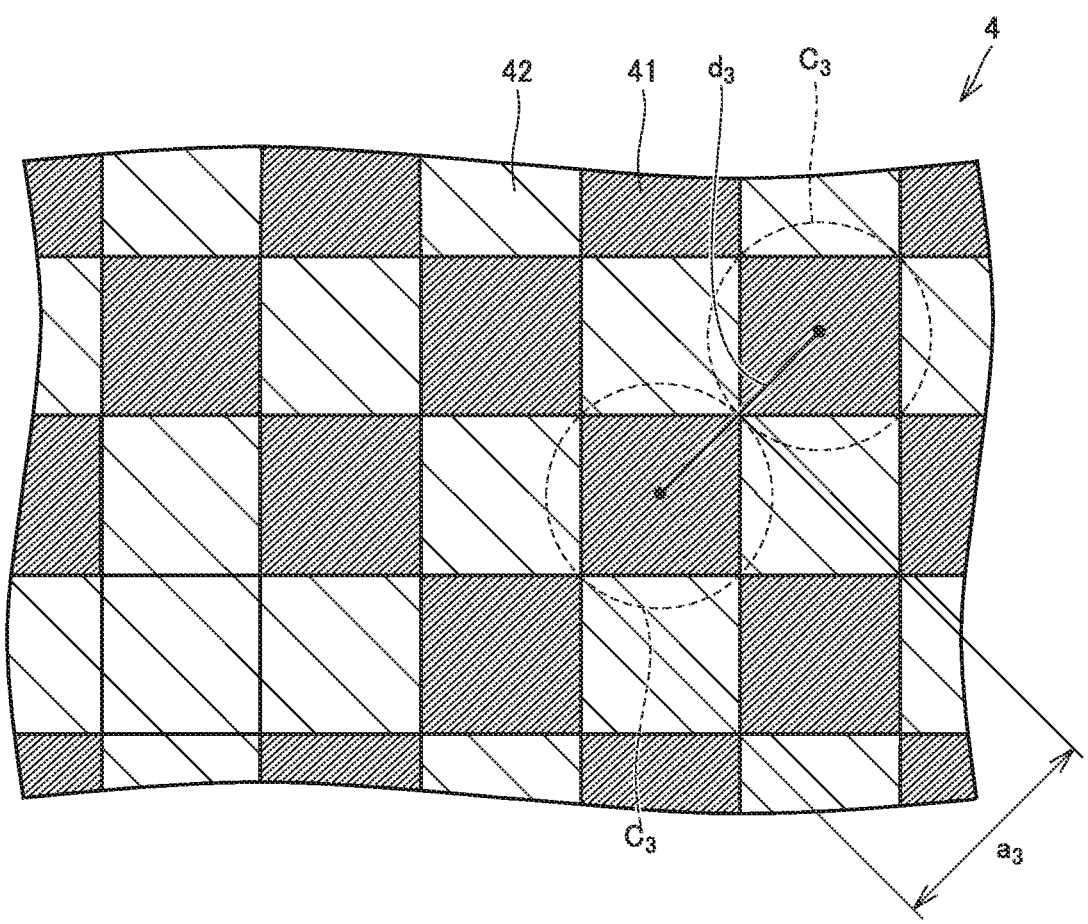
FIG. 4 is a cross-sectional view schematically showing a construction of any cross-section in the in-plane direction of the domain structure layer by way of another example.
Figure 5:
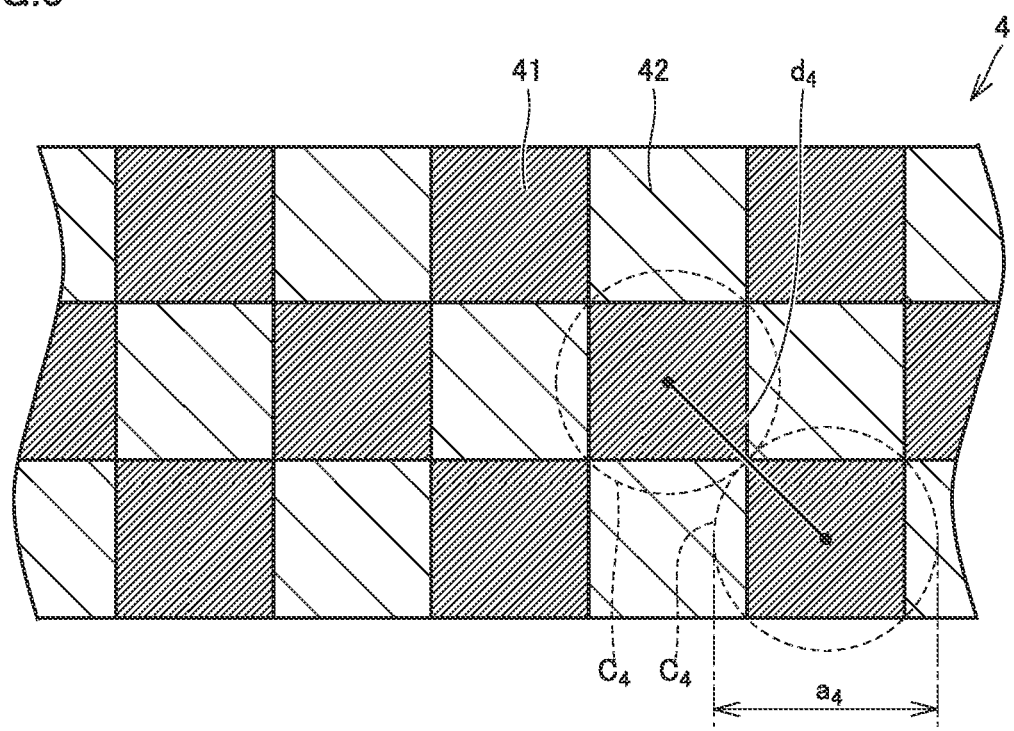
FIG. 5 is a cross-sectional view schematically showing a construction of any cross-section in the direction of thickness of the domain structure layer by way of another example.

FIG. 4 is a cross-sectional view schematically showing a construction in the in-plane direction of the domain structure layer by way of another example, and FIG. 5 is a cross-sectional view schematically showing the construction in the direction of thickness of the domain structure layer by way of another example. In the present embodiment, first domain 41 satisfies (1) to (4) above and second domain 42 also satisfies (1) to (4) above.

FIG. 4, however, shows only a virtual circumcircle $C_3$ of first domain 41 in the in-plane direction of domain structure layer 4, the diameter $a_3$ of virtual circumcircle $C_3$, and each distance $d_3$ between the central point of one virtual circumcircle $C_3$ and the central point of virtual circumcircle $C_3$ in each of a plurality of other first domains 41 adjacent to that one virtual circumcircle $C_3$. Virtual circumcircles and distances for second domains 42 are not shown. Similarly, FIG. 5 shows only a virtual circumcircle $C_4$ of first domain 41 in the direction of thickness of domain structure layer 4, the diameter $a_4$ of virtual circumcircle $C_4$, and each distance $d_4$.

According to such domain structure layer 4, since both of first domain 41 and second domain 42 are of the nanometer order and uniformly distributed, the effect resulting from the nanometer order is higher. Since the interfaces in domain structure layer 4 (a surface of contact between different compounds) also increase, strain energy in domain structure layer 4 is also higher. Therefore, coating 1 including domain structure layer 4 in the present embodiment is higher in hardness and hence higher in wear resistance.

[Third Embodiment: Method of Manufacturing Coating]

Domain structure layer 4 according to the first embodiment and the second embodiment can be fabricated through vapor deposition in which pulsed electric power can be supplied to targets (evaporation sources) serving as source materials for first domain 41 and second domain 42. In particular, since a film manufactured with PVD is denser, higher in hardness, and better in wear resistance and adhesiveness than a film manufactured with CVD, use of PVD is preferred.

Such PVD includes High Power Impulse Magnetron Sputtering (HiPIMS), pulsed magnetron sputtering, pulsed laser ablation, and pulsed vacuum cathodic arc deposition. Among these, HiPIMS is suitable for fabrication of domain structure layer 4, because control of an amount of supply of ions and atoms which can be supplied in response to one pulse is easy and a coating having a dense and smooth surface can be fabricated. A method of manufacturing domain structure layer 4 with HiPIMS will be described with reference to FIG. 6 by way of example of the method of manufacturing domain structure layer 4.

Figure 6:
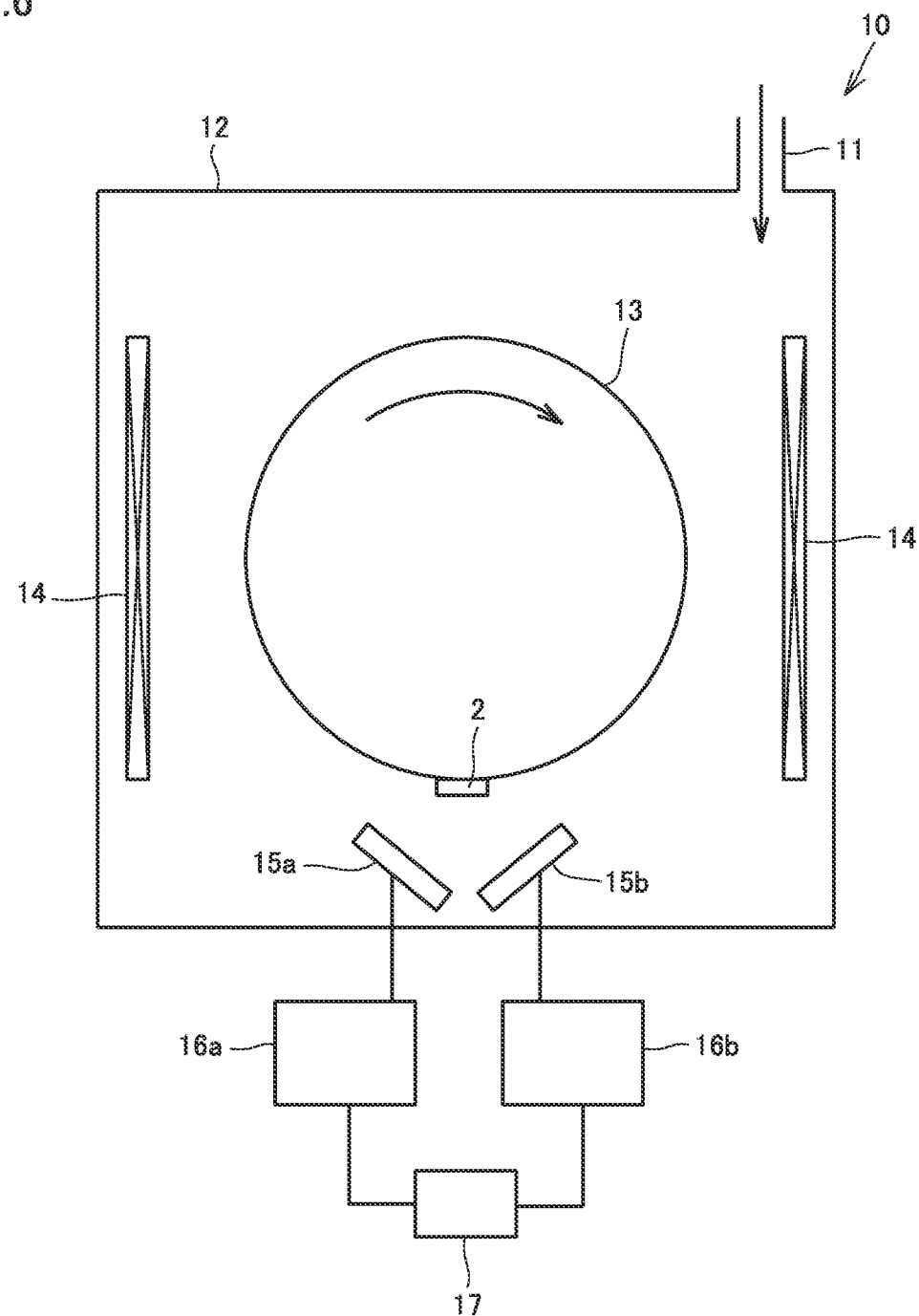
FIG. 6 is a schematic diagram showing a construction of an apparatus used for fabricating a domain structure layer.

FIG. 6 is a schematic diagram showing a construction of an apparatus used for fabricating a domain structure layer. This apparatus 10 is an HiPIMS apparatus with which HiPIMS can be performed. Referring to FIG. 6, apparatus 10 has a vacuum chamber 12 provided with a gas introduction port 11, and in vacuum chamber 12, a substrate holder 13 rotatable in a direction shown with an arrow in the figure with substrate 2 being fixed thereto and a heater 14 capable of heating substrate holder 13 and substrate 2 fixed to substrate holder 13 are arranged.

A substrate bias power supply (not shown) for applying a substrate bias voltage is connected to substrate holder 13. Direct current (DC), pulse DC, HiPIMS, or high frequency (RF) can be used as a substrate bias power supply. For a cutting tool, in particular for a tool used for intermittent cutting such as a milling tool, compressive residual stress is preferably introduced into domain structure layer 4 by enhancing ion bombardment by applying a negative bias voltage to substrate 2. By coating a substrate with the coating including domain structure layer 4 in which compressive residual stress has been introduced, chipping of the substrate such as chipping of a cutting edge can be suppressed.

The "compressive residual stress" herein refers to a type of internal stress (strain energy) present in domain structure layer 4, and to stress expressed by a "−" (minus) numeric value. Therefore, a concept of high compressive residual stress means a larger absolute value of the numeric value, and a concept of low compressive residual stress means a smaller absolute value of the numeric value.

Compressive residual stress accumulated in domain structure layer 4 as above is preferably from −0.2 to −4.0 GPa. When a value for compressive residual stress is smaller than this range, toughness of a cutting edge is insufficient and chipping is likely, and when the value for compressive residual stress exceeds this value, compressive residual stress is excessively high and a coating tends to suffer from micro peeling at the cutting edge. A more preferred value for compressive residual stress is from −0.5 to −2.0 GPa. Compressive residual stress can be measured with a $\sin^2 \psi$ method with the use of an X-ray stress measurement apparatus, a method using Raman spectroscopy, or a method using radiant light.

A substrate bias voltage affects compressive residual stress in domain structure layer 4, a hardness, and denseness of domain structure layer 4, and a value therefor is desirably from −20 to −150 V. When the voltage is lower than this range, wear resistance tends to lower due to lowering in denseness of domain structure layer 4, and when the voltage is higher than this range, compressive residual stress is excessively high. Thus, peeling of the coating from the substrate, for example, peeling of the coating at the cutting edge, is likely. A more preferred range of the substrate bias voltage is from −30 to −100 V.

Evaporation sources 15a and 15b for supplying ions or atoms to substrate 2 are arranged in vacuum chamber 12. Evaporation sources 15a and 15b are composed of elements serving as source materials for first domain 41 and second domain 42, respectively. Normally, a metal element of elements forming each domain is supplied from evaporation sources 15a and 15b, and a non-metal element of elements forming each domain is introduced through gas introduction port 11. It is important that evaporation sources 15a and 15b are arranged such that ions or atoms which have burst therefrom as a result of sputtering reach the same position on substrate holder 13.

Power supplies 16a and 16b are electrically connected to evaporation sources 15a and 15b, respectively, and a synchronization device 17 allowing power supplies 16a and 16b to alternately supply pulsed electric power is electrically connected to power supplies 16a and 16b. Thus, while power supply 16a supplies electric power, pulsed electric power can be supplied to evaporation source 15a whereas electric power cannot be supplied to evaporation source 15b. While power supply 16b supplies electric power, pulsed electric power can be supplied to evaporation source 15b whereas electric power cannot be supplied to evaporation source 15a.

Under the control by synchronization device 17, pulsed electric power supplied alternately by power supplies 16a and 16b supplies a pulse current in the form of a pulse train including one or more pulses to evaporation sources 15a and 15b. Thus, ions or atoms intermittently and alternately burst out of evaporation sources 15a and 15b, and ions or atoms which have burst reach the same position on substrate holder 13.

For example, in fabricating domain structure layer 4 constituted of first domain 41 composed of AlN and second domain 42 composed of TiN with the use of HiPIMS apparatus 10, HiPIMS apparatus 10 is operated as follows.

Firstly, a target composed of Al and a target composed of Ti are attached to evaporation sources 15a and 15b, respectively, and substrate 2 is fixed to substrate holder 13. Then, while vacuum chamber 12 is evacuated, heater 14 heats substrate 2. Then, while an inert gas such as argon gas and nitrogen gas as reaction gas are introduced through gas introduction port 11, electric power is supplied alternately from power supplies 16a and 16b. Thus, pulsed electric power in the form of a pulse train is supplied to evaporation sources 15a and 15b, and ions or atoms alternately burst out of evaporation sources 15a and 15b. Ions or atoms which have burst out of evaporation sources 15a and 15b are deposited alternately on substrate 2.

Various suitable conditions in HiPIMS are different depending on combination of materials forming domains, such as whether a material forming each domain is a system of a solid solution or a non-solid solution in a thermal equilibrium state or whether a material forming another domain two-dimensionally or three-dimensionally grows on a material forming one domain. At least the conditions below are preferably satisfied.

First, in fabrication of domain structure layer 4, a temperature $T_s$ (K) of substrate 2 preferably satisfies a condition of $0.1 \leq T_s/T_m \leq 0.5$, with respect to a melting point $T_m$ (K) of the domain composition with the lowest melting point, among the domains forming domain structure layer 4 (in the present embodiment, first domain 41 and second domain 42). When a value for $T_s/T_m$ is smaller than this range, surface diffusion on substrate 2, of film forming species which have come to substrate 2 is insufficient and consequently a layer composed of a single solid solution tends to be obtained. Alternatively, when a value for $T_s/T_m$ is greater than this range, surface diffusion on substrate 2, of film forming species which have come to substrate 2 is excessively active and hence fabrication of a domain of the nanometer order is difficult or a layer composed of a single solid solution tends to be obtained because a condition close to a thermal equilibrium state is established. Alternatively, phase separation takes place in first domain 41 or second domain 42, or the domain structure layer itself takes on a random structure in which phase separation has taken place, and consequently, domain structure layer 4 having the aimed-at composition may not be obtained.

Secondly, in connection with evaporation sources 15a and 15b, the number of ions or atoms supplied to substrate 2 in response to one pulse train preferably corresponds to 0.1 to 15 monolayers. When the number of ions or atoms is smaller than this range, the domain formed with each evaporation source is excessively small and characteristics as the whole domain structure layer 4 are unfavorably close to characteristics of a layer as composed of a single solid solution. On the other hand, when the number of ions or atoms is greater than this range, a domain is excessively large and it is difficult to exhibit the nanometer size effect. In connection with evaporation sources 15a and 15b, the number of ions or atoms supplied to substrate 2 in response to one pulse train more preferably corresponds to 0.1 to 10 monolayers.

Here, "one pulse train" means electric power intermittently supplied to a single evaporation source. Namely, "one pulse train" means a "pulse train implementing one feed of electric power" in pulsed electric power intermittently supplied to each evaporation source. This one pulse train is constituted of one or more pulses. Furthermore, the expression the number of ions or atoms supplied in response to one pulse train corresponding to 0.1 to 15 monolayers means that the thickness achieved in assuming that a compound film formed on a substrate as a result of reaction between a reaction gas and ions or atoms which have burst out of an evaporation source in response to one pulse train (one feed of electric power) two-dimensionally grows to completely cover the substrate corresponds to 0.1 to 15 monolayers.

For example, when domain structure layer 4 constituted of first domain 41 composed of AlN and second domain 42 composed of TiN is fabricated by intermittently supplying a pulse train constituted of 5 pulses to each of an evaporation source composed of Al and an evaporation source composed of Ti, the above-described value for the source material for first domain 41 can be calculated as follows.

Firstly, an evaporation source composed of Al and a substrate are set in vacuum chamber 12, and electric power in the form of 100 continuous pulses is continuously supplied to the evaporation source while a nitrogen gas as a reaction gas is introduced into vacuum chamber 12. Then, the thickness of the fabricated coating composed of AlN (an AlN coating) is measured. For example, when the fabricated AlN coating has a thickness of 100 Å, the AlN coating having a thickness of 1 Å (approximately 0.5 monolayer) is fabricated per 1 pulse and the AlN coating having a thickness of 5 Å (approximately 2.5 monolayers) is fabricated per one pulse train. Therefore, in this case, the number of ions or atoms of a source material for first domain 41 supplied to substrate 2 in response to one pulse train corresponds to approximately 2.5 monolayers. The value described above can also be calculated for second domain 42 composed of TiN with the same method.

In particular, by controlling the number of ions or atoms (monolayers) supplied in response to one pulse train, each size of first domain 41 and second domain 42 can be controlled. For example, when evaporation source 15a is a source material for first domain 41 and evaporation source 15b is a source material for second domain 42, the number of ions or atoms (monolayers) supplied from evaporation source 15a in response to one pulse train is made smaller than the number of ions or atoms (monolayers) supplied from evaporation source 15b in response to one pulse train, so that domain structure layer 4 as shown in FIGS. 2 and 3 can be fabricated. Alternatively, the number of ions or atoms (monolayers) supplied from evaporation source 15a in response to one pulse train is made substantially equal to the number of ions or atoms (monolayers) supplied from evaporation source 15b in response to one pulse train, so that domain structure layer 4 as shown in FIGS. 4 and 5 can be fabricated.

Though other conditions are not particularly limited in the HiPIMS method above, it is, for example, preferable that the film formation conditions below are satisfied.

Pulse width (pulse time period of a single pulse within a pulse train): 0.01 to 5 ms
Frequency: 0.01 to 2 kHz
Bias voltage: −20 to −150 V
Pressure in chamber: 0.1 to 1 Pa Using the method of manufacturing a coating in the present embodiment, domain structure layer 4 satisfying (1) to (4) above can be fabricated and hence coating 1 including domain structure layer 4 can be manufactured.

Though fabrication of domain structure layer 4 constituted of two types of domains of first domain 41 and second domain 42 has been described above, for example, when domain structure layer 4 is constituted of three types of domains, three evaporation sources should be employed. Here, arrangement should be such that a pulse train is alternately supplied to any evaporation source and ions or atoms can be supplied to the same area on substrate holder 13.

In fabricating a domain structure layer constituted of two types of domains, at least two evaporation sources, at least two pulse power supplies electrically connected to the respective evaporation sources, and one synchronization device electrically connected to the two pulse power supplies are required. In fabricating a domain structure layer constituted of three types of domains, at least three evaporation sources, at least three pulse power supplies electrically connected to the respective evaporation sources, and one synchronization device electrically connected to the three pulse power supplies are required. For the purpose of reducing a time period for film formation, two or more evaporation sources for forming domains may be arranged.

Before fabricating domain structure layer 4 on substrate 2 through the HiPIMS method described above, underlying layer 3 may be provided on substrate 2 and thereafter domain structure layer 4 may be fabricated. For example, when substrate 2 is made of cemented carbide, a solid solution layer composed of a solid solution is preferably fabricated as underlying layer 3 on a surface of cemented carbide, because domain structure layer 4 tends to be fabricated to a desired construction on a surface of a solid solution layer made of single composition more uniformly than on a surface of cemented carbide which is a sintered material consisting of several different compositions.

Though composition of the solid solution layer is not particularly limited, a solid solution composed of an element for evaporation sources 15a and 15b used for forming domain structure layer 4 and an element forming a reaction gas is preferred. Specifically, when first domain 41 is composed of AlN and second domain 42 is composed of TiN, a solid solution layer composed of AlTiN is preferred. Such a solid solution layer can be fabricated by simultaneously supplying pulsed electric power to power supplies 16a and 16b to thereby simultaneously supply a pulse train to evaporation sources 15a and 15b. In this case, the solid solution layer and domain structure layer 4 can exhibit high adhesiveness to each other, and it is not necessary to separately provide an evaporation source for fabricating a solid solution layer. In addition, since a target composed of Al and a target composed of Ti are relatively inexpensive, domain structure layer 4 can inexpensively be manufactured.

As the coating according to the first embodiment and the second embodiment described above in detail and the coating manufactured with the manufacturing method according to the third embodiment are provided on the surface of the substrate, various physical properties derived from the domain structure layer can be provided to the substrate. For example, the coating having the domain structure layer excellent in hardness and wear resistance as described above can suitably be made use of for a tool or a mold. Among others, the coating having the domain structure layer excellent additionally in oxidation resistance would be useful also for an application to a tool exposed to a particularly severe environment.

EXAMPLES

Though the present invention will be described in further detail with reference to Examples below, the present invention is not limited thereto. In Examples below, an underlying layer and a domain structure layer (which may hereinafter simply also be denoted as a "structure layer" in a sense including both of the domain structure layer in the present embodiment and a structure layer in a Comparative Example) are fabricated on a surface of a substrate and a structure of the domain structure layer and physical properties were investigated.

<Study 1>

In Examples in Study 1, a domain structure layer as shown in FIGS. 2 and 3 was fabricated.

[Examples 1 to 15]

(Preparation of Substrate and Target)

Initially, for the purpose of checking a structure and a hardness of a coating, a test piece of which surface to be coated was mirror polished (material name: G10E, manufactured by Sumitomo Electric Industries, Ltd.) was prepared (substrate X). For the purpose of investigating the wear resistance of the coating, an insert for milling (model number: SEET13T3AGSN-G, manufactured by Sumitomo Electric Industries, Ltd.) was prepared (substrate Y). Substrate X and substrate Y were cleaned with an alkali cleaning solution.

Prepared substrate X was set to substrate holder 13 in HiPIMS apparatus 10, a target A was set as evaporation source 15a, and a target B was set as evaporation source 15b.

Each target had a diameter of 4 inches. Composition of target A and target B in Examples 1 to 15 is as shown in Table 1.

(Determination of the Number of Ions or Atoms Per One Pulse Train)

In order to determine the number of ions or atoms (monolayers) per 1 pulse train for each target, the following test was conducted for each target. Initially, while substrate X was heated to 450° C., the pressure in vacuum chamber 12 was lowered to 0.005 Pa. Then, Ar gas was introduced, and the pressure in vacuum chamber 12 was held at 0.8 Pa, and substrate X was cleaned with the use of an Ar ion source at a substrate bias voltage of −600 V for 30 minutes.

Then, the Ar gas was exhausted from vacuum chamber 12, and thereafter each gas was introduced such that a partial pressure in vacuum chamber 12 was set to Ar:$N_2$=0.4 Pa:0.2 Pa. Then, under film formation conditions below, a coating composed of an element for target A and N was fabricated, and the number of ions or atoms (monolayers) per 1 pulse supplied to substrate X was calculated. Based on this result, the number of pulses included in 1 pulse train for target A was adjusted such that the number of ions or atoms per 1 pulse train attained the value shown in Table 1.

Pulse width: 0.1 ms
Pulsed electric power: 60 kW
Frequency: 1 kHz
Bias voltage: −60 V (DC power supply)

Vacuum chamber 12 was then opened, substrate X was replaced with new substrate X, the number of ions or atoms (monolayers) per 1 pulse train for target B was calculated through operations the same as described above, and the number of pulses included in 1 pulse train was adjusted based on this result such that the number of ions or atoms per 1 pulse train for target B attained the value shown in Table 1.

(Fabrication of Coating)

Then, vacuum chamber 12 was again opened, substrate X was replaced with new substrate X, and a pressure in vacuum chamber 12 was lowered to 0.005 Pa while the substrate was heated to 450° C. Then, Ar gas was introduced, the pressure in vacuum chamber 12 was held at 0.8 Pa, and substrate X was cleaned with the use of an Ar ion source at a substrate bias voltage of −600 V for 30 minutes.

Then, the Ar gas was exhausted from vacuum chamber 12, and thereafter each gas was introduced such that a partial pressure in vacuum chamber 12 was set to Ar:$N_2$=0.4 Pa:0.2 Pa. Then, under film formation conditions below, electric power was supplied simultaneously to target A and target B (that is, electric power was supplied continuously to both of target A and target B), so that a solid solution layer (a thickness: 0.1 μm) as the underlying layer was formed on the surface of substrate X. This solid solution layer is composed of a solid solution composed of elements for target A and target B and N.

Pulse width of target A: 0.1 ms
Pulse width of target B: 0.1 ms
Pulsed electric power (targets A and B): 60 kW
Frequency: 1 kHz
Bias voltage: −60 V (DC power supply)

Following the formation of the solid solution layer, electric power was alternately supplied to target B and target A under film formation conditions below (that is, starting with target B, electric power was intermittently supplied to target A and target B), to thereby form a domain structure layer (thickness: 3 μm) on a surface of the solid solution layer. The temperature of the substrate was maintained at 450° C. This domain structure layer was constituted of a second domain composed of an element for target A and N and a first domain composed of an element for target B and N. Tables 1 and 2 show features of each coating.

Pulse width of target A: 0.1 ms
Pulse width of target B: 0.1 ms
Pulsed electric power (targets A and B): 60 kW
Frequency: 1 kHz
Bias voltage: −60 V (DC power supply)

TABLE 1

| | Target A | | Target B | | Entire Structure Layer | |
|---|---|---|---|---|---|---|
| | Composition | Monolayer | Composition | Monolayer | Composition | Al/Ti Ratio |
| Example 1 | Al | 1.6 | Ti | 0.7 | $Al_{0.69}Ti_{0.31}N$ | 2.24 |
| Example 2 | Al | 3.3 | Ti | 1.5 | $Al_{0.69}Ti_{0.31}N$ | 2.27 |
| Example 3 | Al | 4.6 | Ti | 3.1 | $Al_{0.6}Ti_{0.4}N$ | 1.53 |
| Example 4 | Al | 7.5 | Ti | 4.5 | $Al_{0.63}Ti_{0.37}N$ | 1.72 |
| Example 5 | Al | 15.0 | Ti | 7.9 | $Al_{0.66}Ti_{0.34}N$ | 1.95 |
| Example 6 | Ti | 4.7 | Al | 3.0 | $Al_{0.4}Ti_{0.6}N$ | 0.65 |
| Example 7 | $Al_{0.95}B_{0.05}$ | 4.3 | $Ti_{0.95}B_{0.05}$ | 2.9 | $Al_{0.58}Ti_{0.37}B_{0.05}N$ | 1.55 |
| Example 8 | $Al_{0.95}Si_{0.05}$ | 4.0 | $Ti_{0.95}Si_{0.05}$ | 2.6 | $Al_{0.58}Ti_{0.37}Si_{0.05}N$ | 1.57 |
| Example 9 | $Al_{0.95}W_{0.05}$ | 4.3 | $Ti_{0.95}W_{0.05}$ | 2.8 | $Al_{0.58}Ti_{0.37}W_{0.05}N$ | 1.59 |
| Example 10 | $Al_{0.95}Nb_{0.05}$ | 4.1 | $Ti_{0.95}Nb_{0.05}$ | 2.6 | $Al_{0.59}Ti_{0.36}Nb_{0.05}N$ | 1.61 |
| Example 11 | $Al_{0.6}Ti_{0.4}$ | 4.8 | $Al_{0.4}Ti_{0.6}$ | 2.9 | $Al_{0.53}Ti_{0.47}N$ | 1.11 |
| Example 12 | $Al_{0.4}Ti_{0.6}$ | 4.3 | $Al_{0.6}Ti_{0.4}$ | 2.4 | $Al_{0.47}Ti_{0.53}N$ | 0.90 |
| Example 13 | $Al_{0.5}Ti_{0.5}$ | 4.1 | Al | 3.2 | $Al_{0.72}Ti_{0.28}N$ | 2.58 |
| Example 14 | Al | 4.7 | Cr | 3.0 | $Al_{0.61}Cr_{0.39}N$ | — |
| Example 15 | Ti | 4.5 | Cr | 2.2 | $Ti_{0.66}Cr_{0.34}N$ | — |
| Comparative Example 1 | Al | 0.9 | Ti | 0.6 | $Al_{0.62}Ti_{0.38}N$ | 1.61 |
| Comparative Example 2 | Al | 17.1 | Ti | 12.5 | $Al_{0.58}Ti_{0.42}N$ | 1.41 |
| Comparative Example 3 | Al | 4.6 | Ti | 3.1 | $Al_{0.6}Ti_{0.4}N$ | 1.50 |

TABLE 2

| | | | First Domain | | | | | | Second Domain | |
|---|---|---|---|---|---|---|---|---|---|---|
| | | | Size in In-Plane Direction | | Nearest Neighbor Distance in In-Plane Direction | | Size in Thickness Direction | | | |
| | Composition | Crystal Structure | Average (nm) | Scatter (%) | Average (nm) | Scatter (%) | Average (nm) | Scatter (%) | Composition | Crystal Structure |
| Example 1 | TiN | c-NaCl | 1.1 | ±24 | 1.4 | ±23 | 0.5 | ±8 | AlN | c-NaCl |
| Example 2 | TiN | c-NaCl | 1.8 | ±15 | 2.3 | ±16 | 1.0 | ±6 | AlN | c-NaCl |
| Example 3 | TiN | c-NaCl | 3.2 | ±12 | 3.6 | ±11 | 1.6 | ±5 | AlN | c-NaCl |
| Example 4 | TiN | c-NaCl | 4.8 | ±10 | 5.6 | ±9 | 2.5 | ±4 | AlN | c-NaCl |
| Example 5 | TiN | c-NaCl | 9.8 | ±8 | 11.9 | ±8 | 4.8 | ±3 | AlN | h-Wurtzite |
| Example 6 | AlN | c-NaCl | 3.2 | ±12 | 3.6 | ±13 | 1.6 | ±4 | TiN | c-NaCl |
| Example 7 | $Ti_{0.95}B_{0.05}N$ | c-NaCl | 3.1 | ±13 | 3.5 | ±12 | 1.5 | ±5 | $Al_{0.95}B_{0.05}N$ | c-NaCl |
| Example 8 | $Ti_{0.95}Si_{0.05}N$ | c-NaCl | 3.0 | ±11 | 3.4 | ±10 | 1.4 | ±5 | $Al_{0.95}Si_{0.05}N$ | c-NaCl |
| Example 9 | $Ti_{0.95}W_{0.05}N$ | c-NaCl | 2.9 | ±12 | 3.3 | ±11 | 1.5 | ±4 | $Al_{0.95}W_{0.05}N$ | c-NaCl |
| Example 10 | $Ti_{0.95}Nb_{0.05}N$ | c-NaCl | 2.8 | ±13 | 3.2 | ±12 | 1.4 | ±3 | $Al_{0.95}Nb_{0.05}N$ | c-NaCl |
| Example 11 | $Al_{0.4}Ti_{0.6}N$ | c-NaCl | 3.2 | ±12 | 3.7 | ±11 | 1.6 | ±4 | $Al_{0.6}Ti_{0.4}N$ | c-NaCl |
| Example 12 | $Al_{0.6}Ti_{0.4}N$ | c-NaCl | 2.9 | ±12 | 3.4 | ±10 | 1.4 | ±4 | $Al_{0.4}Ti_{0.6}N$ | c-NaCl |
| Example 13 | AlN | c-NaCl | 3.1 | ±11 | 3.3 | ±10 | 1.5 | ±5 | $Al_{0.5}Ti_{0.5}N$ | c-NaCl |
| Example 14 | CrN | c-NaCl | 3.0 | ±11 | 3.4 | ±13 | 1.6 | ±4 | AlN | c-NaCl |
| Example 15 | CrN | c-NaCl | 2.8 | ±10 | 3.4 | ±12 | 1.4 | ±4 | TiN | c-NaCl |
| Comparative Example 1 | TiN | c-NaCl | 0.7 | ±26 | 0.8 | ±24 | 0.3 | ±7 | AlN | c-NaCl |
| Comparative Example 2 | TiN | c-NaCl | 12.3 | ±8 | 13.5 | ±7 | 6.2 | ±3 | AlN | h-Wurtzite |
| Comparative Example 3 | Single Layer c-NaCl Type $Al_{0.6}Ti_{0.4}N$ Coating | | | | | | | | | |

Table 1 shows composition of target A and target B, the number of ions or atoms (monolayers) per 1 pulse train, and composition of the entire structure layer and the Al/Ti ratio in the entire structure layer. Composition and the Al/Ti ratio of the entire structure layer were measured with an X-ray photoelectron spectrometer. The structure layer in each of Examples 1 to 15 is the domain structure layer described above.

Table 2 shows composition and crystal structure of the first domain and the second domain. "c-NaCl" in the field of crystal structure means crystal structure of the cubic NaCl type, and "h-wurtzite" means crystal structure of a hexagonal wurtzite type.

Through the use of 3D atom probe tomography, the structured layer can be confirmed to consist of first domains and second domains whose compositions differ. Furthermore, that the structured layer consists of first domains and second domain whose compositions differ may also be confirmed using the following procedure. Firstly, a sample of the domain structure layer showing the cross-section in the in-plane direction as well as a sample of the domain structure layer showing the cross-section in the thickness direction were prepared. Then, using mechanical and ion milling, a measured portion of each sample was thinned to a thickness (the thickness in the direction normal to the cross section) from 5 to 20 nm. The samples were then imaged using a transmission electron microscope in the HAADF-STEM (High-angle Annular Dark Field Scanning Transmission Electron Microscopy) mode. The differing compositions of the first domains and the second domains could be confirmed by the differing contrast in the HAADF-STEM images.

The crystal structure of each domain could be confirmed using the nanobeam electron diffraction method of the transmission electron microscope. Furthermore, using a high resolution transmission electron microscope to image the above samples with atomic resolution, it could be confirmed that either of the first domain and the second domain had the cubic NaCl crystal structure. In case the first domain consists of the cubic NaCl crystal structure and the second domain consists of the hexagonal wurtzite crystal structure, the electron diffraction patterns of the cubic NaCl crystal structure and of the hexagonal wurtzite crystal structure were seen overlaid in the electron diffraction measurement. Due to this effect, the crystal structures could be confirmed by acquiring dark field images for the diffraction spots of the cubic NaCl crystal structure as well as the diffraction spots of the hexagonal wurtzite crystal structure and comparing the dark field images to the HAADF-STEM images.

The composition of the first domains and the second domains was analyzed using the line scan function of a transmission electron microscope equipped with an energy dispersive X-ray spectrometer.

Table 2 shows the average value of the size in the in-plane direction of the first domain and deviation (scatter) from the average value, the nearest neighbor distance in the in-plane direction of the first domain and deviation (scatter) from the average value, and the average value of the size in the direction of thickness and deviation (scatter) from the average value. For example, though scatter in size in the in-plane direction is denoted as "±24" in Example 1, this means that 95 or more first domains of 100 first domains observed in any cross-section in the in-plane direction have the size within the range of ±24% from the average value of the size of (100) first domains in the in-plane direction. Each size and each scatter were calculated with the use of a transmission electron microscope.

The average size in the in-plane direction of the above mentioned first domains as well as the relative scatter around this average value were evaluated as described below. Firstly, as described above, the samples were thinned to a thickness in the cross-section in the in-plane direction of 10 nm or smaller before being imaged using the HAADF-STEM mode of a transmission electron microscope. Depending on the size of the first domains, the image size was chosen to between 20 nm×20 nm and 50 nm×50 nm.

The brightness and contrast were adjusted so as to obtain a clear contrast of the first domains and the second domains. Then, image analysis software (ImageJ) was used to determine the size and the number of first domains in the HAADF-STEM images and based on this histograms were constructed. Here, the border between first domains and second domains was determined visually, thereby also determining the virtual circumcircle of the first domains.

There have been cases when the above histograms have shown a plurality of peaks. The HAADF-STEM image being a transmission image, this is due to the imaging of two or more different first domains overlapping in the thickness direction of the sample. Imaging two or more different first domains overlapping in the thickness direction of the sample will yield a domain size larger than that of a single first domain, resulting in a histogram with a plurality of peaks.

Therefore, in a histogram with a plurality of peaks, the average size and scatter of the first domains must be determined using the smallest peak in order to extract information from single domains only. In case the peak that corresponds to the smallest measured domain size and the peak that corresponds to the second smallest measured domain size overlap, domains with sizes exceeding those in the valley between the two histogram peaks should be ignored when determining the average and scatter values.

For the same reason, when determining the average value of the nearest neighbor distance in the in-plane direction of the first domains as well as the scatter relative to this value, only single first domains should be used. Furthermore, as to the average size and the scatter relative to this value in the thickness direction, HAADF-STEM images of samples including the cross-section in the thickness direction were used to determine the height of the first domains in the thickness direction.

As it may happen that some of the first domains become truncated in the polishing step, when determining the average size of the first domains and the scatter relative to this value as well as the nearest neighbor distance and the scatter relative to this value from HAADF-STEM images, these first domains may appear smaller than their actual size.

Taking the background of the lighter domains to be 0% contrast and the typical contrast of the darker domains to be 100% contrast, if the first domains are lighter, such as in Examples 1-5, 7-11, 14, and 15, domains showing >50% of the contrast should be discarded, and if the first domains are darker, such as in Examples 6, 12, and 13, domains showing <50% of the contrast should be discarded before the image analysis.

[Comparative Examples 1 to 3]

In Comparative Examples 1 and 2, a coating was fabricated with a method the same as in Example 1 except that the number of ions or atoms per 1 pulse train was changed as shown in Table 1. In Comparative Example 3, a coating was fabricated with a method the same as in Example 3 except that electric power was simultaneously supplied to target A and target B. Tables 1 and 2 also show various features in Comparative Examples 1 to 3.

[Hardness of Coating]

An indentation hardness of the structure layer of each obtained coating was measured by using a nanoindenter ("ENT-1100a" manufactured by Elionix Inc.) and pressing an indenter into the structure layer at a load of 1 g in the direction of normal to a surface of the coating. Table 3 shows results of a hardness of each coating in Examples 1 to 15 and Comparative Examples 1 to 3.

[Wear Resistance of Coating]

A coating according to each of Examples 1 to 15 and Comparative Examples 1 to 3 was fabricated on the surface of substrate Y with the method the same as above. Thus, an insert having a coating formed on the surface of the insert for milling was fabricated. Each obtained insert was subjected to a milling cutting test under conditions below to measure the wear width of a flank face of the insert. Table 3 shows results.

Work material: SCM435 (85 mm wide×300 mm long)
Cutting speed: 230 m/min.
Feed: 0.3 mm/revolution
Depth of cut: 2.0 mm
Cutting oil: none (dry cutting)
Distance of cutting: 3600 mm
Cutting pass: 12
Cutter: WGC4100R (manufactured by Sumitomo Electric Hardmetal Corporation)
One insert was attached to the cutter.

TABLE 3

| | Characteristics (Physical Properties) | |
|---|---|---|
| | Hardness (mgf/$\mu m^2$) | Wear Width (mm) |
| Example 1 | 6051 | 0.072 |
| Example 2 | 6427 | 0.068 |
| Example 3 | 6624 | 0.063 |
| Example 4 | 6283 | 0.067 |
| Example 5 | 5627 | 0.082 |
| Example 6 | 6723 | 0.065 |
| Example 7 | 6834 | 0.061 |
| Example 8 | 6729 | 0.062 |
| Example 9 | 6895 | 0.059 |
| Example 10 | 6687 | 0.065 |
| Example 11 | 5864 | 0.077 |
| Example 12 | 5718 | 0.080 |
| Example 13 | 7142 | 0.057 |
| Example 14 | 6727 | 0.061 |
| Example 15 | 5879 | 0.077 |
| Comparative Example 1 | 3587 | 0.151 |
| Comparative Example 2 | 2794 | 0.223 |
| Comparative Example 3 | 3624 | 0.149 |

Table 3 shows an indentation hardness of the structure layer in the field of "hardness" and a wear width of the coating (the flank face) of the insert before and after the milling cutting test in the field of "wear width". A higher value for the hardness means a higher hardness of the coating, and a smaller wear width means that an amount of wear of the coating is small and wear resistance is high.

[Discussion]

Referring to Tables 1 to 3, the structure layer in each of Examples 1 to 15 had the first domain satisfying all of (1) to (4) above. Namely, the structure layer in each of Examples 1 to 15 was a domain structure layer. The coating having this domain structure layer had a very high hardness not lower than 5500 mgf/$\mu m^2$. Each coating had a wear width not greater than 0.1 mm and had high wear resistance.

In contrast, the structure layer in each of Comparative Examples 1 and 2 did not have the first domain satisfying all of (1) to (4) above. The coating having this structure layer was lower in hardness and wear resistance than the coatings in Examples 1 to 15.

It was considered in this connection that, in Comparative Example 1, the size of the first domain was smaller than (1), and therefore the structure layer had a physical property like a solid solution as a whole and consequently the hardness was substantially as high as that of the conventional AlTiN solid solution. It was considered that, in Comparative Example 2, the size of the first domain was greater than (1), and therefore the nanometer size effect and accumulation of strain energy were not obtained or were insufficient. The second domain having a crystal structure of the hexagonal wurtzite type also seemed to be connected to the inferior characteristics of Comparative Example 2.

In Comparative Example 3, the pulse current was not alternately supplied to targets A and B, instead the pulse current was simultaneously supplied, and hence Comparative Example 3 did not have a structure having a first domain and a second domain, and a coating composed of $Al_{0.6}Ti_{0.4}N$ of the cubic NaCl type was formed. The coating characteristics were equivalent to those of the coating in Comparative Example 1.

<Study 2>

In Examples in Study 2, the domain structure layer as shown in FIGS. 4 and 5 was fabricated.

[Examples 16 to 29 and Comparative Examples 4 and 5]

A coating was fabricated on the surface of substrate X and substrate Y in Examples 16 to 29 and Comparative Examples 4 and 5 with the method the same as in Examples in Study 1 by forming target A and target B of elements shown in Table 4 and adjusting the number of ions or atoms (monolayers) per 1 pulse train as shown in Table 4. The number of ions or atoms per 1 pulse train for target A and target B was controlled by controlling the number of pulses included in 1 pulse train as a film formation condition. Tables 4 and 5 show features of each coating and Table 6 shows physical properties of each coating. The methods for measuring each property are the same as in Study 1.

TABLE 4

|  | Target A | | Target B | | Entire Structure Layer | |
|---|---|---|---|---|---|---|
|  | Composition | Monolayer | Composition | Monolayer | Composition | Al/Ti Ratio |
| Example 16 | Al | 1.5 | Ti | 1.4 | $Al_{0.5}Ti_{0.5}N$ | 1.00 |
| Example 17 | Al | 2.7 | Ti | 2.6 | $Al_{0.5}Ti_{0.5}N$ | 1.00 |
| Example 18 | Al | 3.9 | Ti | 3.8 | $Al_{0.5}Ti_{0.5}N$ | 1.00 |
| Example 19 | Al | 5.8 | Ti | 5.7 | $Al_{0.5}Ti_{0.5}N$ | 1.00 |
| Example 20 | Al | 12.4 | Ti | 12.0 | $Al_{0.5}Ti_{0.5}N$ | 1.00 |
| Example 21 | $Al_{0.95}B_{0.05}$ | 3.6 | $Ti_{0.95}B_{0.05}$ | 3.5 | $Al_{0.48}Ti_{0.48}B_{0.05}N$ | 1.00 |
| Example 22 | $Al_{0.95}Si_{0.05}$ | 3.9 | $Ti_{0.95}Si_{0.05}$ | 3.8 | $Al_{0.48}Ti_{0.48}Si_{0.05}N$ | 1.00 |
| Example 23 | $Al_{0.95}W_{0.05}$ | 3.4 | $Ti_{0.95}W_{0.05}$ | 3.3 | $Al_{0.48}Ti_{0.48}W_{0.05}N$ | 1.00 |
| Example 24 | $Al_{0.95}Nb_{0.05}$ | 3.9 | $Ti_{0.95}Nb_{0.05}$ | 3.8 | $Al_{0.48}Ti_{0.48}Nb_{0.05}N$ | 1.00 |
| Example 25 | $Al_{0.6}Ti_{0.4}$ | 3.6 | $Al_{0.4}Ti_{0.6}$ | 3.6 | $Al_{0.5}Ti_{0.5}N$ | 1.00 |
| Example 26 | $Al_{0.4}Ti_{0.6}$ | 3.6 | $Al_{0.6}Ti_{0.4}$ | 3.6 | $Al_{0.5}Ti_{0.5}N$ | 1.00 |
| Example 27 | $Al_{0.5}Ti_{0.5}$ | 3.3 | Al | 3.4 | $Al_{0.75}Ti_{0.25}N$ | 3.00 |
| Example 28 | Al | 3.9 | Cr | 3.9 | $Al_{0.5}Cr_{0.5}N$ | — |
| Example 29 | Ti | 3.5 | Cr | 3.6 | $Ti_{0.5}Cr_{0.5}N$ | — |
| Comparative Example 4 | Al | 0.7 | Ti | 0.7 | $Al_{0.5}Ti_{0.5}N$ | 1.00 |
| Comparative Example 5 | Al | 20.4 | Ti | 19.8 | $Al_{0.5}Ti_{0.5}N$ | 1.00 |

TABLE 5

|  | First Domain | | | | | | | Second Domain | |
|---|---|---|---|---|---|---|---|---|---|
|  | | | Size in In-Plane Direction | | Nearest Neighbor Distance in In-Plane Direction | | Size in Thickness Direction | | |
|  | Composition | Crystal Structure | Average (nm) | Scatter (%) | Average (nm) | Scatter (%) | Average (nm) | Scatter (%) | Composition | Crystal Structure |
| Example 16 | TiN | c-NaCl | 1.0 | ±25 | 1.0 | ±24 | 0.6 | ±7 | AlN | c-NaCl |
| Example 17 | TiN | c-NaCl | 1.9 | ±14 | 1.9 | ±15 | 1.1 | ±6 | AlN | c-NaCl |
| Example 18 | TiN | c-NaCl | 3.1 | ±13 | 3.1 | ±14 | 1.6 | ±5 | AlN | c-NaCl |
| Example 19 | TiN | c-NaCl | 4.9 | ±9 | 4.9 | ±10 | 2.4 | ±5 | AlN | c-NaCl |
| Example 20 | TiN | c-NaCl | 9.8 | ±7 | 9.8 | ±6 | 5.1 | ±4 | AlN | h-Wurtzite |
| Example 21 | $Ti_{0.95}B_{0.05}N$ | c-NaCl | 3.1 | ±12 | 3.1 | ±11 | 1.5 | ±4 | $Al_{0.95}B_{0.05}N$ | c-NaCl |
| Example 22 | $Ti_{0.95}Si_{0.05}N$ | c-NaCl | 2.9 | ±11 | 2.9 | ±10 | 1.6 | ±5 | $Al_{0.95}Si_{0.05}N$ | c-NaCl |
| Example 23 | $Ti_{0.95}W_{0.05}N$ | c-NaCl | 3.1 | ±10 | 3.1 | ±12 | 1.4 | ±4 | $Al_{0.95}W_{0.05}N$ | c-NaCl |
| Example 24 | $Ti_{0.95}Nb_{0.05}N$ | c-NaCl | 2.8 | ±11 | 2.8 | ±10 | 1.6 | ±5 | $Al_{0.95}Nb_{0.05}N$ | c-NaCl |
| Example 25 | $Al_{0.4}Ti_{0.6}N$ | c-NaCl | 3.2 | ±9 | 3.2 | ±10 | 1.5 | ±5 | $Al_{0.6}Ti_{0.4}N$ | c-NaCl |
| Example 26 | $Al_{0.6}Ti_{0.4}N$ | c-NaCl | 3.1 | ±10 | 3.1 | ±9 | 1.5 | ±4 | $Al_{0.4}Ti_{0.6}N$ | c-NaCl |
| Example 27 | AlN | c-NaCl | 3.0 | ±12 | 3.0 | ±11 | 1.4 | ±5 | $Al_{0.5}Ti_{0.5}N$ | c-NaCl |
| Example 28 | CrN | c-NaCl | 2.9 | ±11 | 2.9 | ±10 | 1.6 | ±4 | AlN | c-NaCl |
| Example 29 | CrN | c-NaCl | 3.1 | ±10 | 3.1 | ±9 | 1.5 | ±4 | TiN | c-NaCl |
| Comparative Example 4 | TiN | c-NaCl | 0.7 | ±23 | 0.7 | ±25 | 0.3 | ±8 | AlN | c-NaCl |
| Comparative Example 5 | TiN | c-NaCl | 15.1 | ±6 | 15.1 | ±7 | 8.4 | ±4 | AlN | h-Wurtzite |

TABLE 6

|  | Characteristics (Physical Properties) | |
| --- | --- | --- |
|  | Hardness (mgf/μm²) | Wear Width (mm) |
| Example 16 | 5816 | 0.078 |
| Example 17 | 6218 | 0.069 |
| Example 18 | 6587 | 0.063 |
| Example 19 | 6089 | 0.071 |
| Example 20 | 5587 | 0.083 |
| Example 21 | 6721 | 0.062 |
| Example 22 | 6648 | 0.065 |
| Example 23 | 6835 | 0.061 |
| Example 24 | 6634 | 0.065 |
| Example 25 | 5869 | 0.077 |
| Example 26 | 5746 | 0.078 |
| Example 27 | 7218 | 0.055 |
| Example 28 | 6545 | 0.067 |
| Example 29 | 6029 | 0.072 |
| Comparative Example 4 | 3438 | 0.161 |
| Comparative Example 5 | 2865 | 0.217 |

[Discussion]

Referring to Tables 4 to 6, the structure layer in each of Examples 16 to 29 had the first domain satisfying all of (1) to (4) above. Namely, the structure layer in each of Examples 16 to 29 was the domain structure layer described above. In the structure layer in each of Examples 16 to 29, the first domain and the second domain were equal to each other in size. This is because the number of ions or atoms per 1 pulse train for target B supplied for fabrication of the first domain was close to the number of ions or atoms per 1 pulse train for target A supplied for fabrication of the second domain. It was confirmed with a transmission electron microscope that the structure layer in each of Examples 16 to 29 had a structure in which the first domain and the second domain were alternately stacked as shown in FIGS. 4 and 5.

Referring to Table 6, the coating in each of Examples 16 to 29 had a very high hardness not lower than 5500 mgf/μm². Each coating had a wear width not greater than 0.1 mm and had high wear resistance.

In contrast, the structure layer in each of Comparative Examples 4 and 5 did not have the first domain satisfying all of (1) to (4) above. The coating having this structure layer was lower in hardness and wear resistance than the coatings in Examples 16 to 29.

It was considered in this connection that, in Comparative Example 4, the size of the first domain was smaller than (1), and therefore the structure layer had a physical property like a solid solution as a whole and consequently the hardness was substantially as high as that of the conventional AlTiN solid solution. It was considered that, in Comparative Example 5, the size of the first domain was greater than (1), and therefore the nanometer size effect and accumulation of strain energy were not obtained or were insufficient. The second domain having crystal structure of the hexagonal wurtzite type seemed to also be relevant to low characteristics of Comparative Example 5.

It should be understood that the embodiments disclosed herein are illustrative and non-restrictive in every respect. The scope of the present invention is defined by the terms of the claims, rather than the embodiments above, and is intended to include any modifications within the scope and meaning equivalent to the terms of the claims.

REFERENCE SIGNS LIST

1 coating; 2 substrate; 3 underlying layer; 4 domain structure layer; 41 first domain; 42 second domain; $C_1$, $C_2$, $C_3$, $C_4$ virtual circumcircle; 10 apparatus; 11 gas introduction port; 12 vacuum chamber; 13 substrate holder; 14 heater; 15a, 15b evaporation source; 16a, 16b power supply; and 17 synchronization device.

The invention claimed is:

1. A coating located on a surface of a substrate, comprising:
   one or more layers,
   at least one of said layers being a domain structure layer constituted of two or more domains different in composition and including at least either of Ti and Al,
   a first domain and a second domain which are two of the two or more domains being composed of at least one element selected from the group consisting of Al, B, Si, and elements of group 4, 5, 6 in the periodic table and at least one element selected from the group consisting of B, O, C, and N,
   a plurality of said first domains being present in said domain structure layer,
   when a size of each said first domain in an in-plane direction of said domain structure layer is defined as a diameter of a virtual circumcircle in contact with said each first domain and a nearest neighbor distance of said each first domain in the in-plane direction of said domain structure layer is defined as a length of a shortest straight line connecting a center of said circumcircle with a center of another circumcircle adjacent to said circumcircle, an average value of the size of said each first domain being not smaller than 1 nm and not greater than 10 nm and an average value of the nearest neighbor distance of said each first domain being not smaller than 1 nm and not greater than 12 nm,
   95% or more of said first domains having a size in a range of not more than ±25% of the average value of said size, and
   95% or more of said first domains having a nearest neighbor distance in a range of not more than ±25% of the average value of said nearest neighbor distance.

2. The coating according to claim 1, wherein
   said domain structure layer is constituted of said first domain and said second domain.

3. The coating according to claim 1, wherein
   one of said first domain and said second domain is composed of a nitride containing at least Al but not containing Ti and the other of said first domain and said second domain is composed of a nitride containing at least Al and Ti.

4. The coating according to claim 3, wherein
   one of said first domain and said second domain is composed of AlN and the other of said first domain and said second domain is composed of where an atomic ratio Al/Ti between Al and Ti in said $Al_xTi_{1-x}N$ is not lower than 1 and not higher than 1.5.

5. The coating according to claim 1, wherein
   one of said first domain and said second domain is composed of a nitride containing at least Al but not containing Ti and the other of said first domain and said second domain is composed of a nitride containing at least Ti but not containing Al.

6. The coating according to claim 5, wherein
   one of said first domain and said second domain is composed of AlN and the other of said first domain and said second domain is composed of TiN.

7. The coating according to claim 1, wherein
   an atomic ratio Al/Ti between Al and Ti in entire said domain structure layer exceeds 1.5.

8. The coating according to claim 1, wherein
said first domain and said second domain are composed of a nitride containing at least Al and Ti, and
an atomic ratio Al/Ti between Al and Ti in one of said first domain and said second domain is not lower than 1 and an atomic ratio Al/Ti between Al and Ti in the other of said first domain and said second domain is lower than 1.

9. The coating according to claim 1, wherein
said first domain and said second domain are crystalline.

10. The coating according to claim 1, wherein
said first domain and said second domain have crystal structure of a cubic NaCl type.

11. The coating according to claim 1, wherein
a plurality of said second domains are present in said domain structure layer,
when a size of each said second domain in the in-plane direction of said domain structure layer is defined as a diameter of a virtual circumcircle in contact with said each second domain and a nearest neighbor distance of said each second domain in the in-plane direction of said domain structure layer is defined as a length of a shortest straight line connecting a center of said circumcircle with a center of another circumcircle adjacent to said circumcircle, an average value of the size of said each second domain is not smaller than 1 nm and not greater than 10 nm and an average value of the nearest neighbor distance of said each second domain is not smaller than 1 nm and not greater than 12 nm,
95% or more of said second domains has a size in a range of not more than ±25% of the average value of said size, and
95% or more of said second domains has a nearest neighbor distance in a range of not more than ±25% of the average value of said nearest neighbor distance.

12. The coating according to claim 1, wherein
said domain structure layer is formed through physical vapor deposition.

* * * * *